United States Patent [19]

Iizuka et al.

[11] Patent Number: 5,182,622
[45] Date of Patent: Jan. 26, 1993

[54] CHARGE COUPLED DEVICE IMAGER HAVING MULTICHANNEL READOUT STRUCTURE

[75] Inventors: Tetsuya Iizuka; Kazuya Yonemoto; Kazushi Wada; Satoshi Nakamura; Koichi Harada, all of Kanagawa, Japan

[73] Assignee: Sony Corporation, Tokyo, Japan

[21] Appl. No.: 899,221

[22] Filed: Jun. 16, 1992

Related U.S. Application Data

[63] Continuation of Ser. No. 725,935, Jun. 27, 1991, abandoned, which is a continuation of Ser. No. 475,013, Feb. 5, 1990, abandoned.

[30] Foreign Application Priority Data

Feb. 14, 1989 [JP] Japan .................................. 1-034569

[51] Int. Cl.$^5$ ...................... H01L 29/78; H01L 27/14; H01L 31/00
[52] U.S. Cl. ............................... 257/231; 358/213.23; 358/213.26; 358/213.29; 257/249
[58] Field of Search ................ 357/24 LR, 24, 24 M; 358/213.22, 213.23, 213.26, 213.27, 213.29

[56] References Cited

U.S. PATENT DOCUMENTS

| 4,242,692 | 12/1980 | Hagiwara . | |
|---|---|---|---|
| 4,513,313 | 4/1985 | Kinoshita et al. | 357/24 LR |
| 4,597,013 | 6/1986 | Matsumoto | 357/24 |
| 4,694,316 | 9/1987 | Chabbal | 357/24 LR |
| 4,750,042 | 6/1988 | Murayama et al. . | |
| 4,807,037 | 2/1989 | Iesaka et al. | 357/24 LR |
| 4,987,466 | 1/1991 | Shibata et al. | 357/24 LR |

FOREIGN PATENT DOCUMENTS

| 0211441 | 2/1987 | European Pat. Off. . | |
|---|---|---|---|
| 55-22852 | 2/1980 | Japan | 357/24 LR |
| 61-194870 | 8/1986 | Japan | 357/24 LR |
| 62-4359 | 1/1987 | Japan | 357/24 LR |

OTHER PUBLICATIONS

IEEE Journal of Solid-State Circuits, vol. SC-13, No. 1, Feb. 1978, pp. 34-51; D. Barbe et al.: "Signal processing with charge-coupled devices."

Primary Examiner—Andrew J. James
Assistant Examiner—Ngan Van Ngo
Attorney, Agent, or Firm—Philip M. Shaw, Jr.

[57] ABSTRACT

With the CCD imager of the present invention, signal charges from the image area are transferred by plural juxtaposed read-out registers. The storage region of the read-out registers, through which electrical charges are transmitted, is narrower in width at the image area side and broader in width at the other read-out register side. By virtue of such arrangement of the storage area, there is formed a potential which becomes shallow at the side of the image area and becomes deep at the side of the other read-out registers. By such potential, signal charge transfer efficiency between the read-out registers is improved.

5 Claims, 3 Drawing Sheets

CHARGE COUPLED DEVICE IMAGER HAVING MULTICHANNEL READOUT STRUCTURE

This is a continuation of co-pending applications Ser. No. 07/475,013 and 07/725,935 filed on Feb. 5, 1990 and Jun. 27, 1991, respectively both now abandoned.

BACKGROUND OF THE INVENTION

1. Field of the Invention

This invention relates to a CCD (charge coupled device) imager in which signal charges are transferred by a plurality of juxtaposed read-out registers.

2. Description of the Prior Art

In a CCD imager, such as an interline transfer (IT) or frame interline transfer (FIT) type CCD imager, there is known a structure, such as from the Japanese Patent Laid Open Publication No. 59-13369 (1984), in which, for reducing the read-out frequency of the horizontal register, signal readout is performed by a plurality of horizontal registers.

FIG. 1 shows an example of a dual read-out FIT type CCD imager in which signal read-out is performed by two horizontal registers. Signal charges are produced by photoelectric conversion in an image area 101 and transferred via a storage area 102 to a first horizontal register 103 and a second horizontal register 104. This storage area 102 is made up of a plurality of vertical registers and signal charges of every second vertical register are allocated to the first horizontal register 103 and the second horizontal register 104. It is noted that the signal charges to be transferred to the second horizontal register 104 at the distant side from the image area 101 are transferred by way of the first horizontal register 103.

However, the above described CCD imager is beset with the problem that the transfer efficiency between the horizontal registers can not be improved.

That is, the transfer electrodes of the horizontal registers 103, 104 are arranged, in view of the transfer along the horizontal direction, at a predetermined pitch along the horizontal direction. However, the vertical length of the transfer electrode of the horizontal register becomes longer than the horizontal length, such that, with an increase in the vertical length $l_1$ of the electrode 105, as shown in FIG. 2, changes in the potential along the vertical direction are correspondingly reduced. The result is that flat potential portions are produced to lower the charge transfer efficiency from the first horizontal register 103 to the second horizontal register 104 in the vertical direction.

In order to solve this problem, fine potential steps can be formed, such as by ion implantation, along the vertical direction of the transfer electrode of the horizontal register. However, in such case, the manufacturing process is significantly complicated due to the necessity of forming photo resists and so forth.

SUMMARY OF THE INVENTION

It is an object of the present invention to provide a CCD imager in which the transfer efficiency between a plurality of juxtaposed read-out registers can be improved.

The CCD imager of the present invention is provided with an image containing a plurality of photo-sensitive regions which generate electric charges, a plurality of juxtaposed read-out registers for transferring and reading out electric charges from the image area in one direction, a first one of the read-out registers being closer to the image area than a second one of the read-out registers, and a transfer gate provided between the first read-out register and the second read-out register and being capable of transferring the electric charges from the first read-out register to the second read-out register. A channel stop region is provided under the transfer gate to guide the electric charges. A first plurality of transfer electrodes extend from the image area through the read-out registers, each increasing in width in the region of the first read-out register the width of the transfer electrode being taken in the read-out registers, such that the transfer electrodes are wider at the end near the second read-out register than the end near the image area.

The CCD imager of the present invention includes a plurality of photo-sensitive regions arrayed in a matrix configuration, and horizontal registers as read-out registers which transfer signal charges from these photo-sensitive regions by way of vertical registers are each provided for one column of the matrix. The photo-sensitive regions, the horizontal registers and the vertical registers are formed on a semiconductor substrate. Storage regions and transfer regions are formed in each horizontal register sequentially, alternately in the horizontal transfer direction. These storage and transfer regions correspond in structure to the transfer electrodes. The transfer electrodes are formed on the semiconductor substrate through an insulating film, and clock pulses are separately applied to the transfer electrodes.

DETAILED DESCRIPTION OF THE INVENTION

The CCD imager of the present invention is a FIT type CCD having two juxtaposed horizontal registers, in which the charge transfer efficiency is improved thanks to the shape of storage regions of the horizontal register.

Figure 1:
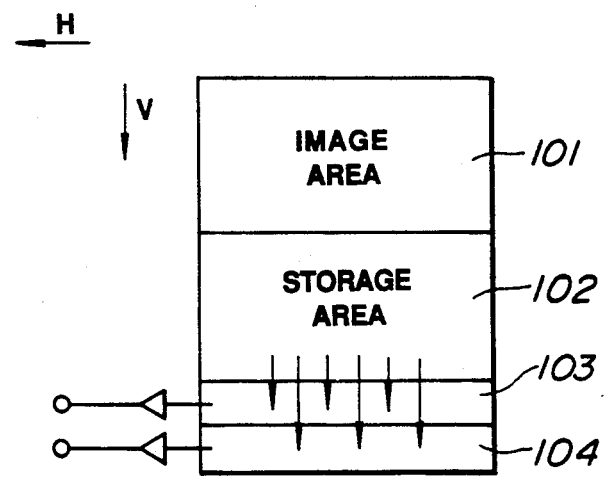
FIG. 1 is a schematic view for illustrating a conventional dual read-out CCD.
Figure 2:
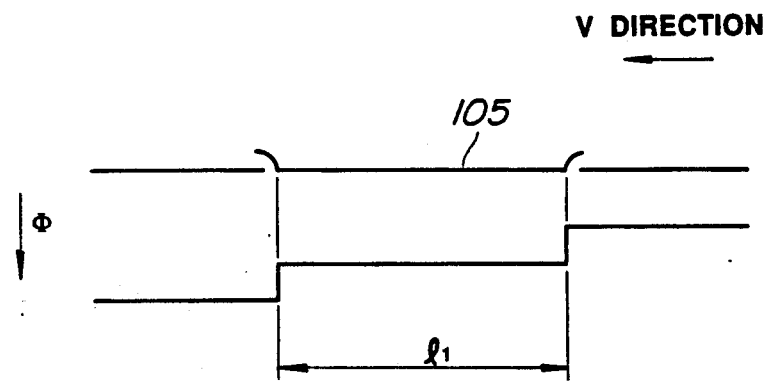
FIG. 2 is a schematic view for illustrating the problem inherent in the horizontal register of the conventional CCD depicted in FIG. 1.
Figure 3:
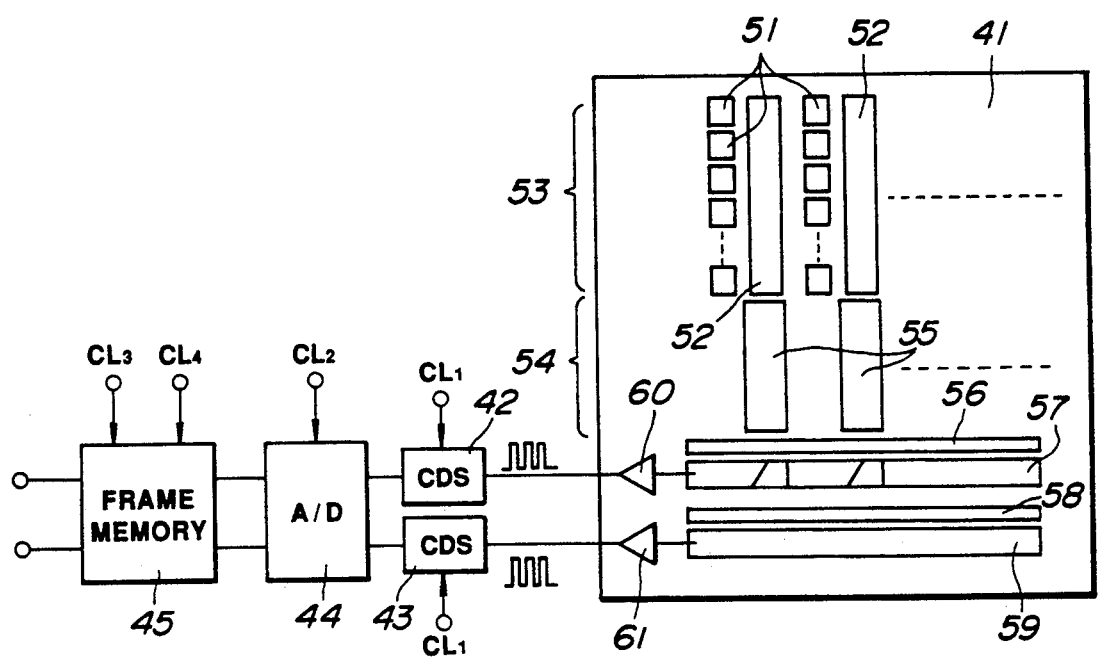
FIG. 3 is a block diagram for illustrating the overall structure of a CCD imager according to an FIG. 4 is a plan view showing essential parts of the CCD imager shown in FIG. 3.

Before proceeding to the description of the horizontal register, the CCD imager will be explained briefly with reference to FIG. 3. Photo-sensitive regions 51 are arranged in a matrix configuration in a CCD imager 41 and a plurality of vertical registers 52 are provided one for each column in the vertical direction or in the up-and-down direction in FIG. 4 of the CCD imager 41. An image area 53 is made up of these photo-sensitive regions 51 and the first vertical registers 52. Contiguous to the ends of these first vertical registers 52 are second vertical registers 55 functioning as a storage area 54 of the FIT type CCD imager. On the ends opposite to the first vertical registers 52 of the second vertical register 55, there is provided a first horizontal register 57 with a transfer gate 56 in-between. This first horizontal register 57 transfers electrical charges in the horizontal direction, that is, in the left-and-right direction in FIG. 4, while functioning as the charge transfer channel or route to the other horizontal register 59. As will be explained subsequently, the width of the storage region within the horizontal register is changed in the vertical direction (as viewed in FIG. 4) so that it is narrower at the image area side than at the second horizontal register side to improve the efficiency of the vertical charge transfer in the first horizontal register 57. Beyond the first horizontal register 57 in the vertical direction, a second horizontal register 59 is provided in juxtaposition to the first horizontal register 57 with a transfer gate 58 in-between. This second horizontal register 59 transfers the charges in the horizontal direction, similarly to the first horizontal register 57, which charges have been transferred to the second horizontal register 59 by way of the storage region in the first horizontal register 57.

Figure 4:
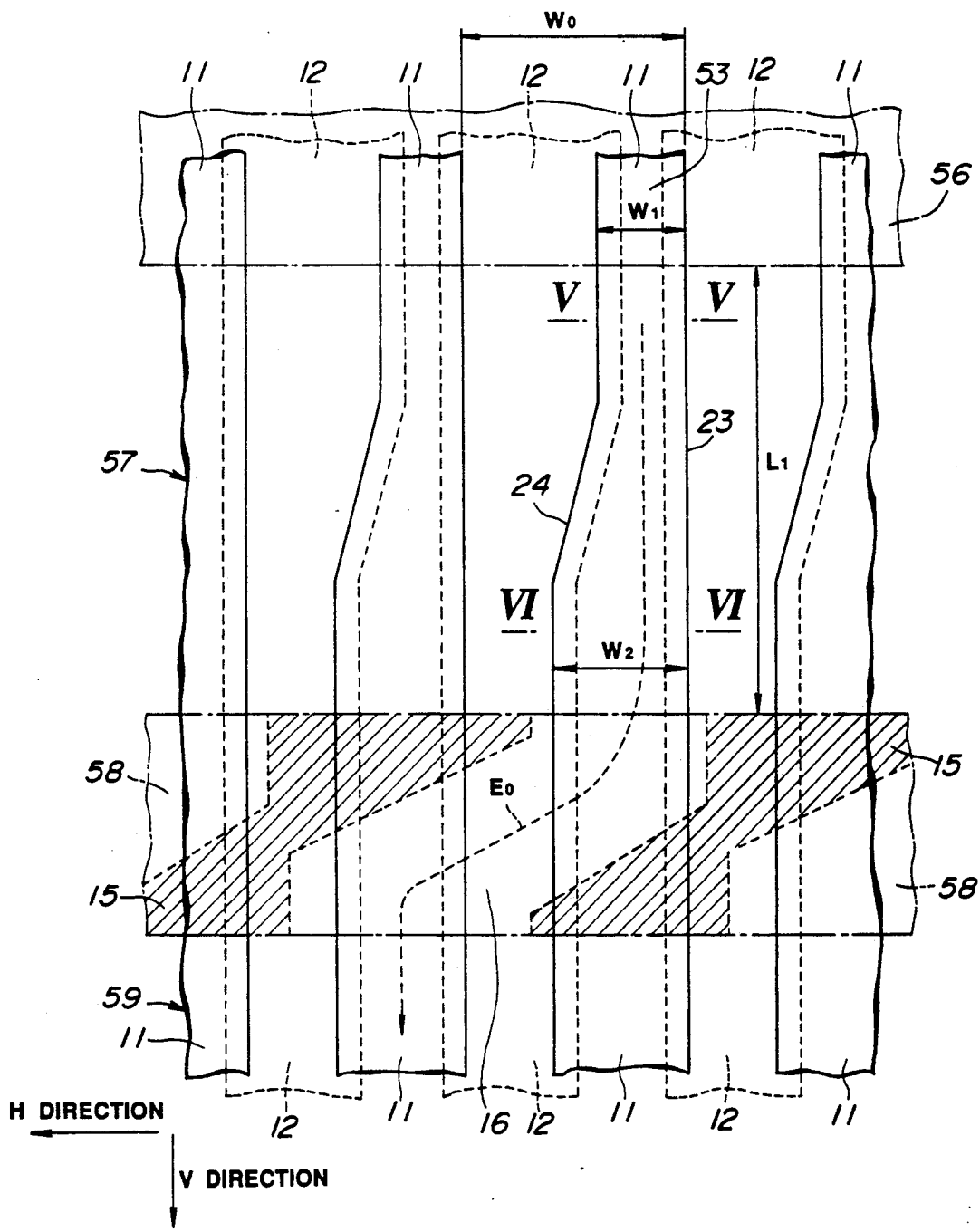

Referring to FIG. 4, the first and the second horizontal registers will be explained in more detail. The first horizontal register 57 and the second horizontal register 59, provided each with transfer electrodes, formed by second and third polysilicon layers, are arranged in juxtaposition to each other. Transfer gates 56 and 58 are formed by a first polysilicon layer. The transfer gate 56 is provided between the second vertical register and the first horizontal register 57 to a predetermined width in the horizontal direction in the drawing as the longitudinal direction. The transfer gates 56, 58 arrayed with a distance $L_1$ therebetween and in juxtaposition to each other. Below the transfer gate 58, a channel stop region 15 shown by hatched lines is formed by selective introduction therein of impurities. The channel stop region 15 is provided at the end of every second storage region of the first horizontal register 57, and functions to render the first horizontal register electrically nonconductive with respect to the second horizontal register 59 thanks to the thus formed potential barrier. The region under the transfer gate 58 where the channel stop region 15 is not formed thus functions as a channel region 16, by means of which charges are transferred from the first horizontal register 57 to the second horizontal register 59.

The second polysilicon layer forms transfer electrodes 11, corresponding to the storage regions, in the first horizontal register 57 and the second horizontal register 59. The storage regions in a P type semiconductor substrate or well are formed by an N type impurity implantation using the transfer gates 56, 58 as a mask prior to forming these transfer electrodes 11. These transfer electrodes 11 are arranged in a plurality of patterns with a dimension $W_0$ as the pitch, and are extended from the upper part of the transfer gate 56 across the first horizontal register 57 as far as the transfer gate 58 and thence to the second horizontal register 59 for functioning as the transfer electrode of the second horizontal register 59. The transfer electrode 11 is formed with the vertical direction in the drawing as the longitudinal direction. Above all, the transfer electrode 11 in the first horizontal register 57 is so contoured that a confronting side 23 in the charge transfer direction or in the H direction is substantially linear and the other confronting side 24 is bent or nonlinear so that the width $W_1$ of the transfer electrode 11 at the side of the image area 53 is narrower than the width $W_2$ at the side of the second horizontal register 59. Since the contour of the transfer electrode 11 corresponds to that of the storage region, the width $W_1$ of the storage region at the side of the image area is lesser than the width $W_2$ thereof at the side of the second horizontal register 59. It is noted that the lower portion of the transfer electrode 11 similarly functions as the storage region in the second horizontal register 59.

Figure 5:
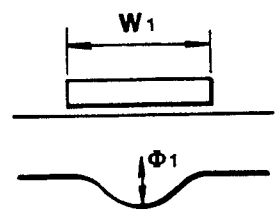
FIG. 5 is a diagram showing a potential curve along line V—V in FIG. 4.
Figure 6:
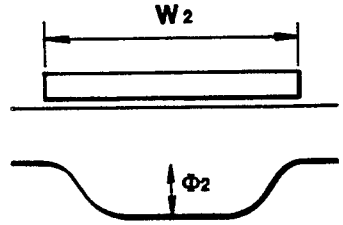
FIG. 6 is a diagram showing a potential curve along line VI—VI in FIG. 4.

FIGS. 5 and 6 show the state of the potential at the storage region of the first register 57. FIG. 5 is taken along line V—V in FIG. 4 and shows the state of the potential at the side of the image area of the storage region. FIG. 6 is taken along line VI—VI of FIG. 4 and shows the state of the potential at the side of the second horizontal register 59 of the storage region. With a narrower width $W_1$ of the storage region, as shown in FIG. 5, the potential depth $\phi_1$ becomes shallow under the effect of the potential of the neighboring region. With a broader width $W_2$ of the storage region, as shown in FIG. 6, the potential depth $\phi_2$ becomes deep. Hence, in FIG. 4, the potential depth becomes deeper in proceeding from the side of the image area 53 towards the side of the second horizontal register 59 in spite of the fact that the storage regions have a uniform impurity concentration. The gradient of the potential enables signal charges to be transferred more easily to the second horizontal register 59.

In the first horizontal register 57 and the second horizontal register 59, the third polysilicon layer proves to be the transfer electrodes 12 corresponding to the transfer regions within the register. The transfer regions are formed in the semiconductor substrate by an impurity implantation using the transfer electrodes 11 as a mask. These transfer electrodes 12 are formed in the first horizontal register 57 adjacent to the transfer electrode 11 contoured so as to be enlarged towards the second horizontal register 59, with the sides of the transfer electrodes 12 overlapping with the transfer electrodes 11. Similarly to the transfer electrode 11, the transfer electrode 12 is extended from the upper region of the transfer gate 56 through the first horizontal register 57 as far as the transfer gate 58 and thence extended further to the second horizontal register 59 for functioning as the transfer electrode. Within the horizontal registers 57 and 59, the transfer electrode 12 functions as the transfer region.

In FIG. 4, interlayer insulating films and so forth are not shown for clarity.

With the above described CCD imager of the present invention, having the first horizontal register 57, electrical charges are transferred on a transfer route $E_0$ shown by an arrow in FIG. 4. Thus the charges on the first horizontal register 57, which are not impeded in transfer by the channel stop region 15, are transferred to the second horizontal register 59, under the control of the transfer gate 58. As shown in FIGS. 5 and 6, the potential in the transfer route $E_0$ becomes deeper, as the side end of the second register 59 is approached, for performing an efficient charge transfer. Thus a horizontal charge transfer can be realized, in which the read-out frequency is lowered by virtue of the horizontal registers 57 and 59. In the CCD imager production process, there is no necessity of increasing the number of process steps since it only suffices to change the masks.

Turning again to FIG. 3, an embodiment in which the output from a CCD imager 41 is issued without phase synchronizing or coinciding, is explained.

It is known that with a conventional CCD imager having two horizontal registers the signal of one of the horizontal registers is phase-shifted by 180° with respect to the other. With the CCD imager 41 of the present embodiment, however, signals having the same phase are outputted. Thus the signals outputted from output buffers 60, 61 of the CCD 41 are not subjected to half-bit synchronizing or coinciding treatment and are thus of the same phase with respect to each other. The signals from the output buffers 60, 61 are processed by correlated double sampling circuits (CDS) 42, 43 before being converted from the analog state into the digital state by an A/D converter 44. When the signals are outputted in this manner without coincidizing treatment, a clock $CL_1$ can be used in common in the correlated double sampling circuits 42, 43. The same can apply for the clock $CL_2$ supplied to the A/D converter 44. This helps eliminate the problem of pulse signal coupling and relieves the load which would be caused by generation of a number of clock types. A frame memory 45 is provided to receive the output of the A/D converter 44. The coinciding can be performed using clocks $CL_3$ and $CL_4$ supplied to the frame memory 45. In this manner, low-speed signals suffice at the downstream side of the frame memory 45 to simplify the pulses while reducing costs.

The present invention is not only applicable to a CCD imager in which the signals are outputted without a coinciding operation, but can also be applied to a CCD imager in which half-bit coinciding is performed in one of the horizontal registers. The CCD imager of the present invention is not limited to the FIT type structure, but can also be of an IT type structure. Although the foregoing description has been made of a CCD imager making use of two horizontal registers, the present invention can also be applied to a CCD imager making use of three or more horizontal registers in which the storage region of one of the horizontal registers transferring signal charges to the other registers is so contoured in plan as to have a narrow width on the side of the image area and a broad width on the side of the other registers.

We claim:
1. A CCD imager comprising
    (a) an image area containing a plurality of photo-sensitive regions which generate electric charges;
    (b) first and second juxtaposed read-out registers for transferring and reading out electric charges from the image area in one direction, the first read-out register being closer to the image area than the second read-out register;
    (c) a transfer gate provided between the first read-out register and the second read-out register and being capable of transferring the electric charges from the first read-out register to the second read-out register;
    (d) a first set of pairs of spaced apart transfer electrodes extending from the image area through the first and second read-out registers;
    (e) a second set of pairs of spaced apart transfer electrodes extending from the image area through the first and second read-out registers;
    (f) wherein one of the electrodes of each pair of the first and second sets of transfer electrodes is tapered to increase in width in the region of the first read-out register, the width of the tapered transfer electrode being taken in the direction of electric charge transfer in the first and second read-out registers, such that the tapered transfer electrodes are wider at the end near the second read-out register than at the end near the image area;
    (g) a first channel stop region provided under the transfer gate and corresponding to the first set of transfer electrodes to prevent the electric charges flowing from the first read-out register to the second read-out register through the transfer gate; and
    (h) a second channel stop region provided under the transfer gate and corresponding to the second set of transfer electrodes to guide the electric charges flowing from under a portion of the second set of transfer electrodes and corresponding to the first read-out register to under a portion of the first set of transfer electrodes corresponding to the second read-out register through the transfer gate;
    (i) wherein the first channel stop region and the second channel stop region both extend across the entire width of the tapered transfer electrodes to present the electric charges from flowing under the transfer gate to the tapered transfer electrodes.

2. The CCD imager according to claim 1 wherein the first and second read-out registers are horizontal registers and wherein the photo-sensitive regions are in a matrix configuration and further comprising a first plurality of vertical registers in the image area for transferring the electric charges from the photo-sensitive regions toward the first read-out registers.

3. The CCD imager according to claim 2 further comprising a second plurality of vertical registers for transiently storing the electric charges between the first plurality of vertical registers and the first and second read-out registers.

4. The CCD imager according to claim 1 wherein the first set of transfer electrodes are spaced from one another in the read-out direction and contain storage regions.

5. The CCD imager according to claim 4 wherein the transfer gate is comprised of a first electrode layer between the first and second read-out registers and wherein the first and second transfer electrodes are formed jointly from second and third electrode layers.

* * * * *